US012588374B2

(12) United States Patent
Zhou et al.

(10) Patent No.: US 12,588,374 B2
(45) Date of Patent: Mar. 24, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Kun Zhou, Wuhan (CN); Ping Zhong, Wuhan (CN); Shaojing Wu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 722 days.

(21) Appl. No.: 17/779,813

(22) PCT Filed: Apr. 25, 2022

(86) PCT No.: PCT/CN2022/088972
§ 371 (c)(1),
(2) Date: May 25, 2022

(87) PCT Pub. No.: WO2023/197373
PCT Pub. Date: Oct. 19, 2023

(65) Prior Publication Data
US 2023/0329049 A1     Oct. 12, 2023

(30) Foreign Application Priority Data
Apr. 12, 2022     (CN) .......................... 202210378472.5

(51) Int. Cl.
*H10K 50/86*     (2023.01)
*H10K 59/122*     (2023.01)
(Continued)

(52) U.S. Cl.
CPC ......... *H10K 59/131* (2023.02); *H10K 59/122* (2023.02); *H10K 59/8792* (2023.02)

(58) Field of Classification Search
CPC . H10K 50/865; H10K 59/122; H10K 59/8792
See application file for complete search history.

(56) References Cited

U.S. PATENT DOCUMENTS

2014/0036179 A1     2/2014  Huang et al.
2016/0322444 A1     11/2016  Kang et al.
(Continued)

FOREIGN PATENT DOCUMENTS

CN            105280669 A       1/2016
CN            106057830 A      10/2016
(Continued)

OTHER PUBLICATIONS

PCT International Search Report for International Application No. PCT/CN2022/088972, mailed on Dec. 27, 2022, 10pp.
(Continued)

*Primary Examiner* — Michele Fan
(74) *Attorney, Agent, or Firm* — The Roy Gross Law Firm, LLC; Roy D. Gross

(57) ABSTRACT

A display panel and a display device are disclosed. The display panel includes a normal display area and a fan-out display area, and the fan-out display area includes a first area and a second area. Pixel driving circuit units of the display panel are located in the normal display area and the first area, and fan-out wirings are located in the second area. A shielding layer is disposed on one side of a pixel definition layer away from a substrate, and second openings of the shielding layer are defined corresponding to first openings of the pixel definition layer, thereby being beneficial to improve visible mura.

10 Claims, 5 Drawing Sheets

(51) Int. Cl.
  *H10K 59/131* (2023.01)
  *H10K 59/80* (2023.01)

(56) References Cited

U.S. PATENT DOCUMENTS

| | | | | |
|---|---|---|---|---|
| 2017/0373124 | A1* | 12/2017 | Yang | H10D 86/441 |
| 2019/0103455 | A1 | 4/2019 | Song et al. | |
| 2020/0185467 | A1 | 6/2020 | Sun et al. | |
| 2021/0083230 | A1* | 3/2021 | Li | H10K 59/123 |
| 2021/0278920 | A1 | 9/2021 | Tang et al. | |
| 2023/0189575 | A1* | 6/2023 | Yuk | H10K 50/865 |
| | | | | 257/40 |
| 2023/0217728 | A1* | 7/2023 | Park | H10K 59/88 |
| | | | | 257/88 |
| 2023/0238402 | A1* | 7/2023 | Lee | H01L 27/12 |
| | | | | 257/72 |

FOREIGN PATENT DOCUMENTS

| | | | | | |
|---|---|---|---|---|---|
| CN | 106783936 | A | | 5/2017 | |
| CN | 108153071 | A | | 6/2018 | |
| CN | 109671742 | A | | 4/2019 | |
| CN | 110707132 | A | | 1/2020 | |
| CN | 110794610 | A | | 2/2020 | |
| CN | 111613654 | A | | 9/2020 | |
| CN | 112151585 | A | * 12/2020 | ......... | H01L 27/3246 |
| CN | 113035890 | A | * 6/2021 | ......... | H01L 27/1222 |
| CN | 113035921 | A | | 6/2021 | |
| CN | 113327516 | A | | 8/2021 | |
| CN | 214848636 | U | | 11/2021 | |
| CN | 113745252 | A | | 12/2021 | |
| CN | 114237422 | A | | 3/2022 | |
| JP | 2012132960 | A | | 7/2012 | |
| KR | 20180011982 | A | | 2/2018 | |
| WO | 2008032647 | A1 | | 3/2008 | |
| WO | 2020154875 | A1 | | 8/2020 | |
| WO | 2020186984 | A1 | | 9/2020 | |

OTHER PUBLICATIONS

PCT Written Opinion of the International Search Authority for International Application No. PCT/CN2022/088972, mailed on Dec. 27, 2022, 8pp.

Korean Office Action issued in corresponding Korean Patent Application No. 10-2022-7026260 dated Feb. 16, 2024, pp. 1-10, 20pp.

Chinese Office Action issued in corresponding Chinese Patent Application No. 202210378472.5 dated May 9, 2024, pp. 1-7, 14pp.

Japanese Office Action issued in corresponding Japanese Patent Application No. 特願2023-514107 dated May 7, 2024, pp. 1-4, 8pp.

* cited by examiner

DISPLAY PANEL AND DISPLAY DEVICE

CROSS REFERENCE TO RELATED APPLICATIONS

This application is a National Phase of PCT Patent Application No. PCT/CN2022/088972 having International filing date of Apr. 25, 2022, which claims the benefit of priority of Chinese Patent Application No. 202210378472.5, filed Apr. 12, 2022, the contents of which are all incorporated herein by reference in their entirety.

FIELD OF INVENTION

The present disclosure relates to the field of display technologies, and more particularly, to a display panel and a display device.

BACKGROUND OF INVENTION

With development of organic light-emitting diode (OLED) panel technologies, narrow bezel techniques have become a differentiated technique that attracts user groups. Fan-out in AA (FIAA) technique, that is, fan-out wirings in display areas, is used as a new layout method, which can effectively reduce lower bezels of panels. In the FIAA technique, a design of introducing multiple layers of connecting wirings is used to squeeze out wiring space for fan-out wirings. However, during wiring processes of the connecting wirings, limitation of wiring space easily causes densities of metal wirings in fan-out display areas and normal display areas to be different. Different densities easily cause light reflected from metal wirings to be uneven, thereby causing a visible uneven display (mura) phenomenon in the fan-out display areas and the normal display areas when screens are turned off and turned on.

Technical problem: an embodiment of the present disclosure provides a display panel and a display device to solve a technical problem of a visible display mura phenomenon in the fan-out display areas and the normal display areas caused by the densities of the metal wirings in the fan-out display areas and the normal display areas being different in current display panels and display devices.

SUMMARY OF INVENTION

In order to solve the above problem, the present disclosure provides technical solutions as follows.

The present disclosure provides a display panel, which includes a normal display area and a fan-out display area disposed on one side of the normal display area, wherein, the fan-out display area includes a first area and a second area arranged in sequence in a direction from the normal display area toward the fan-out display area, and the display panel includes:

a substrate;

a driving circuit layer disposed on one side of the substrate and including a plurality of pixel driving circuit units and a plurality of fan-out wirings, wherein, the pixel driving circuit units are disposed in the normal display area and the first area, the fan-out wirings are disposed in the second area, and a density of the pixel driving circuit units disposed in the first area is greater than a density of the pixel driving circuit units disposed in the normal display area;

at least one connecting wiring layer disposed on one side of the driving circuit layer away from the substrate, wherein, each connecting wiring layer includes a plurality of connecting wirings;

a plurality of anodes disposed on one side of the at least one connecting wiring layer away from the substrate, wherein, the pixel driving circuit units are electrically connected to corresponding anodes by the connecting wirings;

a pixel definition layer disposed on one side of the at least one connecting wiring layer away from the substrate and including a plurality of first openings exposing at least a part of the anodes; and a light-emitting layer disposed in the first openings;

wherein, the display panel further includes a shielding layer, the pixel definition layer and the shielding layer use a same light-shielding material, and the shielding layer is disposed on one side of the pixel definition layer away from the substrate and includes a plurality of second openings defined corresponding to the first openings.

Based on the display panel provided in the present disclosure, an orthographic projection of the second openings on the substrate covers an orthographic projection of the first openings on the substrate.

Based on the display panel provided in the present disclosure, a ratio of an orthographic projection area of the second openings on the substrate to an orthographic projection area of the first openings on the substrate ranges from 1 to 1.5.

Based on the display panel provided in the present disclosure, an orthographic projection of the first openings on the substrate covers an orthographic projection of the second openings on the substrate.

Based on the display panel provided in the present disclosure, a ratio of an orthographic projection area of the second openings on the substrate to an orthographic projection area of the first openings on the substrate ranges from 0.8 to 1.

Based on the display panel provided in the present disclosure, the light-emitting layer covers a side wall and a bottom of the second openings.

Based on the display panel provided in the present disclosure, a thickness of the shielding layer in a direction perpendicular to the substrate ranges from 1 μm to 1.5 μm.

Based on the display panel provided in the present disclosure, a material of the shielding layer includes a black matrix.

Based on the display panel provided in the present disclosure, the shielding layer is disposed between the cathode and the pixel definition layer.

The present disclosure provides a display panel, which includes a normal display area and a fan-out display area disposed on one side of the normal display area, wherein, the fan-out display area includes a first area and a second area arranged in sequence in a direction from the normal display area toward the fan-out display area, and the display panel includes:

a substrate;

a driving circuit layer disposed on one side of the substrate and including a plurality of pixel driving circuit units and a plurality of fan-out wirings, wherein, the pixel driving circuit units are disposed in the normal display area and the first area, the fan-out wirings are disposed in the second area, and a density of the pixel driving circuit units disposed in the first area is greater than a density of the pixel driving circuit units disposed in the normal display area;

at least one connecting wiring layer disposed on one side of the driving circuit layer away from the substrate, wherein, each connecting wiring layer includes a plurality of connecting wirings;

a plurality of anodes disposed on one side of the at least one connecting wiring layer away from the substrate, wherein, the pixel driving circuit units are electrically connected to corresponding anodes by the connecting wirings;

a pixel definition layer disposed on one side of the at least one connecting wiring layer away from the substrate and including a plurality of first openings exposing at least a part of the anodes; and a light-emitting layer disposed in the first openings;

wherein, the display panel further includes a shielding layer disposed on one side of the pixel definition layer away from the substrate and including a plurality of second openings defined corresponding to the first openings.

Based on the display panel provided in the present disclosure, an orthographic projection of the second openings on the substrate covers an orthographic projection of the first openings on the substrate.

Based on the display panel provided in the present disclosure, a ratio of an orthographic projection area of the second openings on the substrate to an orthographic projection area of the first openings on the substrate ranges from 1 to 1.5.

Based on the display panel provided in the present disclosure, an orthographic projection of the first openings on the substrate covers an orthographic projection of the second openings on the substrate. Based on the display panel provided in the present disclosure, an orthographic projection of the first openings on the substrate covers an orthographic projection of the second openings on the substrate.

Based on the display panel provided in the present disclosure, a ratio of an orthographic projection area of the second openings on the substrate to an orthographic projection area of the first openings on the substrate ranges from 0.8 to 1.

Based on the display panel provided in the present disclosure, the light-emitting layer covers a side wall and a bottom of the second openings.

Based on the display panel provided in the present disclosure, a thickness of the shielding layer in a direction perpendicular to the substrate ranges from 1 μm to 1.5 μm.

Based on the display panel provided in the present disclosure, a material of the shielding layer includes a black matrix.

Based on the display panel provided in the present disclosure, the shielding layer is disposed between the cathode and the pixel definition layer.

Based on the display panel provided in the present disclosure, the at least one connecting wiring layer includes a first connecting wiring layer and a second connecting wiring layer, and the display panel further includes a first planarization layer, a second planarization layer, and a third planarization layer stacked in sequence in a direction away from the substrate;

the first planarization layer covers the side of the driving circuit layer away from the substrate, the first connecting wiring layer is disposed between the first planarization layer and the second planarization layer, and the second connecting wiring layer is disposed between the second planarization layer and the third planarization layer; and the driving circuit layer is electrically connected to the connecting wirings in the first connecting wiring layer by through-holes penetrating the first planarization layer, the first connecting wiring layer is electrically connected to the connecting wirings in the second connecting wiring layer by through-holes penetrating the second planarization layer, and the second connecting wiring layer is electrically connected to the anodes by through-holes penetrating the third planarization layer.

An embodiment of the present disclosure further provides a display device, which includes a display panel including a normal display area and a fan-out display area disposed on one side of the normal display area, wherein, the fan-out display area includes a first area and a second area arranged in sequence in a direction from the normal display area toward the fan-out display area, and the display panel includes:

a substrate;

a driving circuit layer disposed on one side of the substrate and including a plurality of pixel driving circuit units and a plurality of fan-out wirings, wherein, the pixel driving circuit units are disposed in the normal display area and the first area, the fan-out wirings are disposed in the second area, and a density of the pixel driving circuit units disposed in the first area is greater than a density of the pixel driving circuit units disposed in the normal display area;

at least one connecting wiring layer disposed on one side of the driving circuit layer away from the substrate, wherein, each connecting wiring layer includes a plurality of connecting wirings;

a plurality of anodes disposed on one side of the at least one connecting wiring layer away from the substrate, wherein, the pixel driving circuit units are electrically connected to corresponding anodes by the connecting wirings;

a pixel definition layer disposed on one side of the at least one connecting wiring layer away from the substrate and including a plurality of first openings exposing at least a part of the anodes; and a light-emitting layer disposed in the first openings;

wherein, the display panel further includes a shielding layer disposed on one side of the pixel definition layer away from the substrate and including a plurality of second openings defined corresponding to the first openings.

Beneficial effect: the beneficial effect of the present disclosure is that in the display panel and the display device provided in the present disclosure, by disposing the shielding layer on one side of the pixel definition layer away from the substrate and allowing the second openings of the shielding layer to correspond to the first openings of the pixel definition layer, the shielding layer can be used to block light reflected by metal wirings. Therefore, the light reflected by the metal wirings in the fan-out display area and the normal display area are more uniform, thereby being beneficial to improve a visible mura phenomenon in the fan-out display area and the normal display area caused by densities of the metal wirings in the fan-out display area and the normal display area being different when screens are turned off and turned on.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

Figure 1:
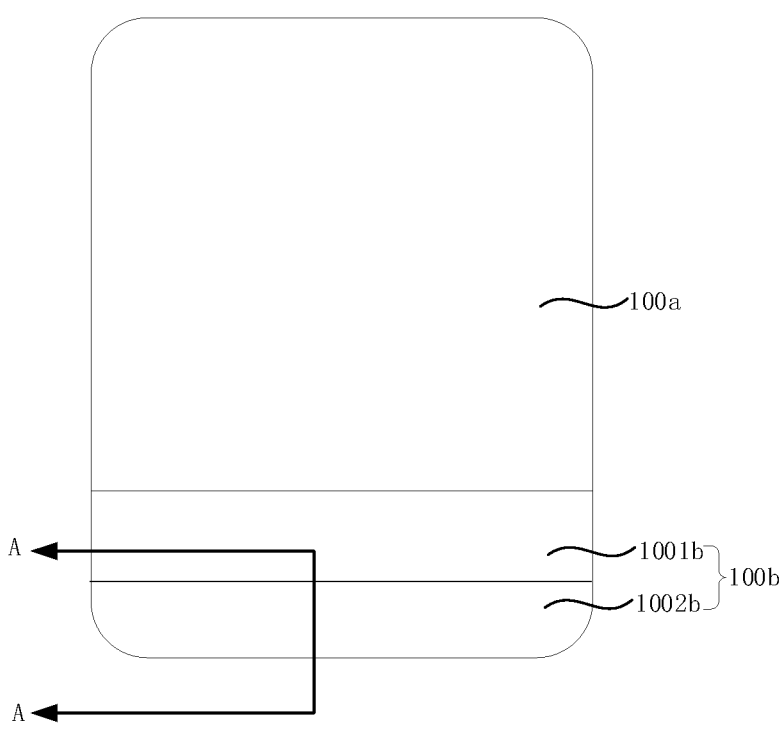
FIG. 1 is a schematic planar diagram of a display panel according to an embodiment of the present disclosure.

Elements in the drawings are designated by reference numerals listed below.

100a: normal display area; 100b: fan-out display area; 1001b: first area; 1002b: second area;

101: substrate; 102: barrier layer; 103: buffer layer; 104: driving circuit layer; 105: first planarization layer; 106: first connecting wiring layer; 107: second planarization layer; 108: second connecting wiring layer; 1081: connecting wiring; 109: third planarization layer; 110: anode; 111: pixel definition layer; 112: shielding layer; 113: light-emitting layer; 114: cathode; 115: pixel unit; 104a: pixel driving circuit units; 104b: fan-out wirings; 1041: active layer; 1042: first gate insulating layer; 1043: first gate electrode layer; 1044: second gate insulating layer; 1045: second gate electrode layer; 1046: first interlayer dielectric layer; 1047: second interlayer dielectric layer; 1048: first source and drain electrode metal layer; 1049: fourth planarization layer; 1050: second source and drain electrode metal layer; V1: first opening; and V2: second opening.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure. In addition, it should be understood that the specific embodiments described herein are only used to illustrate and explain the disclosure and are not used to limit the disclosure. In the present disclosure, in the case of no explanation to the contrary, the orientation words used such as "on" and "under" usually refer to upper and lower directions of the device in actual use or working state, and specifically the directions in the drawings; and "inside" and "outside" refers to the outline of the device.

Figure 2:
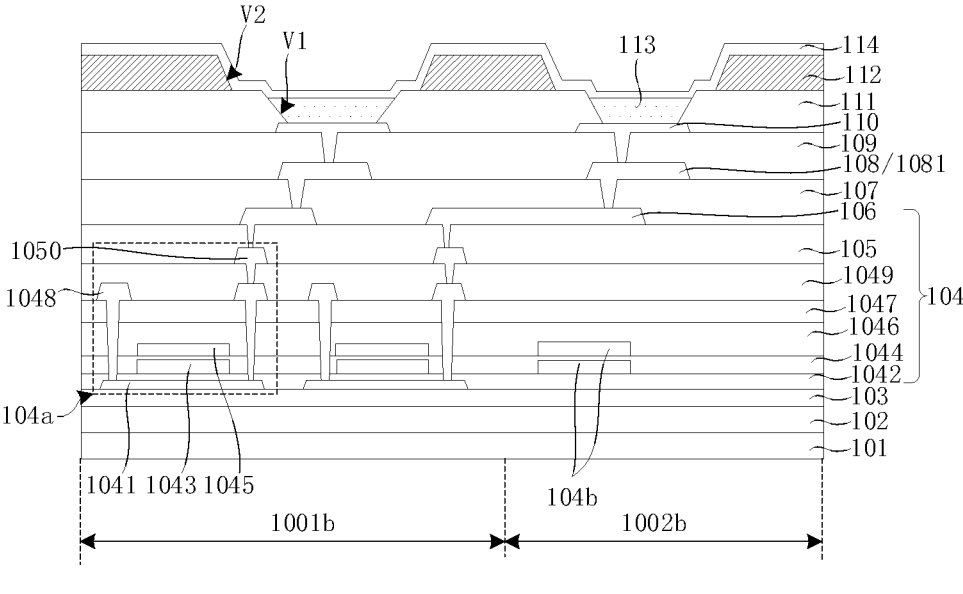
FIG. 2 is a first schematic cross-sectional structural diagram of the display panel along line A-A in FIG. 1.

Referring to FIGS. 1 and 2, FIG. 1 is a schematic planar diagram of a display panel according to an embodiment of the present disclosure, and FIG. 2 is a first schematic cross-sectional structural diagram of the display panel according to an embodiment of the present disclosure. The display panel provided in this embodiment includes a normal display area 100a and a fan-out display area 100b disposed on one side of the normal display area 100a. The fan-out display area 100b includes a first area 1001b and a second area 1002b arranged in sequence in a direction from the normal display area 100a toward the fan-out display area 100b. The display panel includes a substrate 101, a driving circuit layer 104, a connecting wiring layer, a plurality of anodes 110, a pixel definition layer 111, and a light-emitting layer 113.

The fan-out display area 100b is disposed adjacent to the normal display area 100a, and the fan-out display area 100b may be disposed on an edge of the display panel. Further, in this embodiment, the fan-out display area 100b is disposed on a lower edge of the display panel.

The driving circuit layer 104 is disposed on one side of the substrate 101 and includes a plurality of pixel driving circuit units 104a and a plurality of fan-out wirings 104b. The pixel driving circuit units 104a are disposed in the normal display area 100a and the first area 1001b, and the fan-out wirings 104b are disposed in the second area 1002b. At least one connecting wiring layer is disposed on one side of the driving circuit layer 104 away from the substrate 101, and each connecting wiring layer includes a plurality of connecting wirings 1081. The plurality of anodes 110 are disposed on one side of a top layer of the at least one connecting wiring layer away from the substrate 101, and the pixel driving circuit units 104a are electrically connected to corresponding anodes 110 by the connecting wirings 1081. The pixel definition layer 111 is disposed on one side of the at least one connecting wiring layer away from the substrate 101 and includes a plurality of first openings V1 exposing at least a part of the anodes 110. The light-emitting layer 113 is disposed in the first openings V1.

Wherein, the display panel further includes a shielding layer 112 disposed on one side of the pixel definition layer 111 away from the substrate 101, and the shielding layer 112 includes a plurality of second openings V2 defined corresponding to the first openings V1.

It can be understood that in current technology, each two adjacent light-emitting pixels in display areas of display panels have a same spacing between each other. That is, pixel densities in the display areas are same everywhere. Since each light-emitting pixel is electrically connected to a corresponding pixel driving circuit unit 104a, in current technology, densities of the pixel driving circuit units 104a in the display areas of the display panels are same everywhere, and each two adjacent pixel driving circuit units 104a have a same spacing between each other.

The display panel of the present disclosure includes the normal display area 100a and the fan-out display area 100b. A position of each light-emitting pixel and a spacing between two adjacent light-emitting pixels in the fan-out display area 100b are consistent with those in the normal display area 100a. That is, a pixel density of the fan-out display area 100*b* is same as a pixel density of the normal display area 100*a*. However, a difference between the present disclosure and current technology is that in the present disclosure, the pixel driving circuit units 104*a* in the fan-out display area 100*b* are electrically connected to corresponding anodes 110 by the connecting wirings 1081 to drive corresponding light-emitting pixels in the fan-out display area 100*b* to emit light. The disposition of the connecting wiring layer can allow all pixel driving circuit units 104*a* in the fan-out display area 100*b* to be concentrated in the first area 1001*b* of the fan-out display area 100*b* without changing original positions of the light-emitting pixels in the fan-out display area 100*b*, and allow the second area 1002*b* to be not provided with any of the pixel driving circuit units 104*a*. Therefore, the second area 1002*b* can be used to dispose the fan-out wirings 104*b*. Compared to the fan-out wirings 104*b* being disposed in a non-display area of the display panels in current technology, since the fan-out wirings 104*b* of the present disclosure can be disposed in the display area, an area of the display area is increased, and an area of the non-display area is reduced, thereby being beneficial to further realizing narrow bezels and full-screen technology.

Specifically, by reducing the spacing between every two adjacent pixel driving circuit units 104*a* in the fan-out display area 100*b* or reducing a size of the pixel driving circuit units 104*a* in the fan-out display area 100*b*, an overall space occupied by all the pixel driving circuit units 104*a* located in the fan-out display area 100*b* can be reduced, and a partial space of the driving circuit layer 104 in the fan-out display area 100*b* can be squeezed out for disposing the fan-out wirings 104*b*. Of course, other methods may also be used, and it is not limited in the present disclosure.

As can be seen from the above, in the present disclosure, since the pixel driving circuit units 104*a* in the fan-out display area 100*b* are all concentrated in the first area 1001*b* of the fan-out display area 100*b*, a density of the pixel driving circuit units 104*a* located in the first area 1001*b* is greater than a density of the pixel driving circuit units 104*a* located in the normal display area 100*a*. Since the pixel driving circuit units 104*a* include a plurality of metal wirings, a density of the metal wirings in the first area 1001*b* is greater than a density of the metal wirings in the normal display area 100*a*.

Further, first, the fan-out wirings 104*b* are disposed in the second area 1002*b* of the fan-out display area 100*b*, and the fan-out wirings 104*b* are metal wirings newly introduced into the fan-out display area 100*b*; and second, due to limitation of arrangement space, a density of the connecting wirings 1081 in the fan-out display area 100*b* is greater than a density of the connecting wirings 1081 in the normal display area 100*a*, and the connecting wirings 1081 are transparent metal wirings. Therefore, in the present disclosure, the density of the metal wirings in the fan-out display area 100*b* is greater than the density of the metal wirings in the normal display area 100*a*, and a density difference between the metal wirings easily causes a visible mura phenomenon in the fan-out display area 100*b* and the normal display area 100*a*.

Based on this, in the present disclosure, by disposing the shielding layer 112 on one side of the pixel definition layer 111 away from the substrate 101 and allowing the second openings V2 of the shielding layer 112 to correspond to the first openings V1 of the pixel definition layer 111, the shielding layer 112 can be used to block light reflected by the metal wirings. Therefore, the light reflected by the metal wirings in the fan-out display area 100*b* and the normal display area 100*a* are more uniform, thereby being beneficial to improve the visible mura phenomenon in the fan-out display area 100*b* and the normal display area 100*a* caused by the densities of the metal wirings in the fan-out display area 100*b* and the normal display area 100*a* being different when screens are turned off and turned on.

In the embodiments of the present disclosure, a display area of the display panel is composed of the normal display area 100*a* and the fan-out display area 100*b*, so both the normal display area 100*a* and the fan-out display area 100*b* have display function, and the fan-out wirings 104*b* are disposed in the fan-out display area 100*b*. The display panel further includes a non-display area (not shown in the figure), and the fan-out display area 100*b* is disposed on one side of the normal display area 100*a*. Specifically, the fan-out display area 100*b* is disposed between the normal display area 100*a* and the non-display area.

Further, the display panel further includes a driver chip, and the driver chip may also be disposed in the fan-out display area 100*b*. In this case, the non-display area may be omitted, so the display panel can realize frameless and full screen.

In this embodiment, the substrate 101 is a flexible substrate, and the flexible substrate is generally an organic polymer material, such as polyimide and polyethylene terephthalate.

In this embodiment, between the substrate 101 and the driving circuit layer 104, a barrier layer 102 and a buffer layer 103 are further stacked in sequence along a direction away from the substrate 101. The barrier layer 102 is used to block water and oxygen to prevent external water vapor or oxygen from eroding the display panel. A material of the barrier layer 102 includes one or more of silicon oxide, silicon nitride, silicon oxynitride, or amorphous silicon. The buffer layer 103 mainly plays a role of buffering and protection, and a material of the buffer layer 103 includes one or both of silicon nitride and silicon oxide.

The pixel driving circuit units 104*a* include a plurality of thin film transistors. In this embodiment of the present disclosure, the thin film transistors may be thin film transistors with a double gate structure. Specifically, the thin film transistors include an active layer 1041, a first gate insulating layer 1042, a first gate electrode layer 1043, a second gate insulating layer 1044, a second gate electrode layer 1045, a first interlayer dielectric layer 1046, a second interlayer dielectric layer 1047, and a first source and drain electrode metal layer 1048 disposed in sequence along the direction away from the substrate 101. Wherein, the first source and drain electrode metal layer 1048 is electrically connected to the active layer 1041 by through-holes penetrating through the second interlayer dielectric layer 1047, the first interlayer dielectric layer 1046, the second gate insulating layer 1044, and the first gate insulating layer 1042. Of course, in some embodiments, the thin film transistors may also be thin film transistors having only one gate electrode layer. In addition, the thin film transistors may also be top gate or bottom gate structures, which is not limited in the present disclosure.

In this embodiment, the anodes 110 may use a stacked structure of indium tin oxide (ITO)/silver (Ag)/ITO. ITO has good water blocking properties, which can prevent water vapor or oxygen from diffusing to the light-emitting layer 113 through the anodes 110. Therefore, black spots on the display panel caused by the light-emitting layer 113 being corroded by water vapor or oxygen can be prevented, thereby improving display effect of the display panel.

It should be noted that the pixel definition layer 111 defines the plurality of first openings V1, and the first openings V1 are pixel openings. In the embodiments of the present disclosure, the first openings V1 refer to effective light-emitting pixel openings, and an orthographic projection area of the first openings V1 on the substrate 101 is an orthographic projection area of the light-emitting layer 113 on the substrate 101.

In this embodiment, the at least one connecting wiring layer includes two connecting wiring layers, and specifically includes a first connecting wiring layer 106 and a second connecting wiring layer 108. The display panel further includes a first planarization layer 105, a second planarization layer 107, and a third planarization layer 109 stacked in sequence along the direction away from the substrate 101. The first planarization layer 105 covers the side of the driving circuit layer 104 away from the substrate 101, the first connecting wiring layer 106 is disposed between the first planarization layer 105 and the second planarization layer 107, and the second connecting wiring layer 108 is disposed between the second planarization layer 107 and the third planarization layer 109. The driving circuit layer 104 is electrically connected to the connecting wirings 1081 in the first connecting wiring layer 106 by through-holes penetrating the first planarization layer 105, the first connecting wiring layer 106 is electrically connected to the connecting wirings 1081 in the second connecting wiring layer 108 by through-holes penetrating the second planarization layer 107, and the second connecting wiring layer 108 is electrically connected to corresponding anodes 110 by through-holes penetrating the third planarization layer 109.

Specifically, the connecting wiring layers are transparent conductive layers, and the connecting wirings 1081 are transparent wirings. A material of the connecting wirings 1081 is a transparent conductive material, and the transparent conductive material includes any one of indium tin oxide, indium oxide, indium zinc oxide, or silver nanowires.

Of course, in other embodiments, the at least one connecting wiring layer may also have three layers, four layers, five layers, . . . or even more layers, which is not limited in the present disclosure. Correspondingly, the display panel also needs to dispose a corresponding number of planarization layers for disposing between two adjacent connecting wiring layers. Specifically, a material of the planarization layers includes transparent organic materials, and the transparent organic materials include polyimide and photoresist materials.

Further, the thin film transistors may also be designed with double source and drain electrode metal layers to reduce impedance. Specifically, the thin film transistors also include a second source and drain electrode metal layer 1050 and a fourth planarization layer 1049. The fourth planarization layer 1049 covers one side of the first source and drain electrode metal layer 1048 away from the substrate 101, the second source and drain electrode metal layer 1050 is disposed on one side of the fourth planarization layer 1049 away from the substrate 101, and the first planarization layer 105 covers one side of the second source and drain electrode metal layer 1050 away from the substrate 101. The first source and drain electrode metal layer 1048 is electrically connected to the second source and drain electrode metal layer 1050 by through-holes penetrating the fourth planarization layer 1049, and the second source and drain electrode metal layer 1050 is electrically connected to the connecting wirings 1081 in the first connecting wiring layer 106 by through-holes penetrating the first planarization layer 105.

In this embodiment, the fan-out wirings 104*b* are disposed in a same layer as the first gate electrode layer 1043 or the second gate electrode layer 1045, and are prepared in a same process step as the first gate electrode layer 1043 or the second gate electrode layer 1045.

In the embodiment, a thickness of the shielding layer 112 in a direction perpendicular to the substrate 101 ranges from 1 μm to 1.5 μm. The thickness of the shielding layer 112 should not be too large or too small. If the thickness is too large, the overall thickness of the display panel will increase, which is contrary to the current trend of thinner and lighter displays. If the thickness is too small, the light shielding effect will be poor and is not beneficial to improve the visible mura phenomenon.

Optionally, the thickness of the shielding layer 112 in the direction perpendicular to the substrate 101 may be 1 μm, 1.1 μm, 1.2 μm, 1.3 μm, 1.4 μm, or 1.5 μm. In this embodiment, the thickness of the shielding layer 112 in the direction perpendicular to the substrate 101 is 1.2 μm.

In the embodiments of the present disclosure, a material of the shielding layer 112 includes a black matrix. Of course, in some embodiments, the material of the shielding layer 112 may be other light shielding materials, which is not limited in the present disclosure.

In the embodiments of the present disclosure, the shielding layer 112 may be formed by plasma enhanced chemical vapor deposition (PECVD). In other embodiments, the shielding layer 112 may also be formed by chemical vapor deposition or atomic layer deposition.

Figures 3, 4:
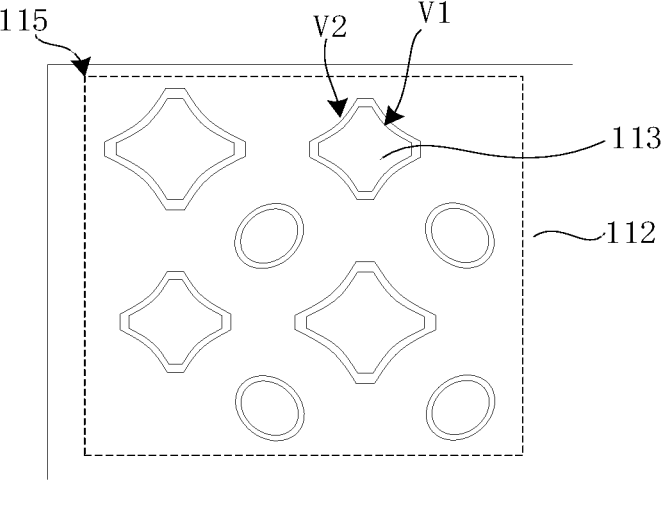
FIG. 3 is a partial schematic structural top view of first openings and second openings of the display panel in FIG. 2 according to an embodiment of the present disclosure.
FIG. 4 is a second schematic cross-sectional structural diagram of the display panel along line A-A in FIG. 1.
Figure 5:
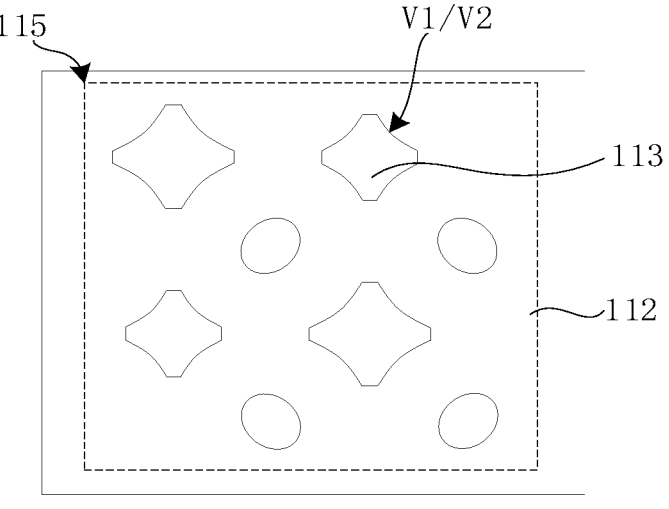
FIG. 5 is a partial schematic structural top view of the first openings and the second openings of the display panel in FIG. 4 according to an embodiment of the present disclosure.

In an embodiment of the present disclosure, referring to FIGS. 2 to 5, FIG. 3 is a partial schematic structural top view of the first openings and the second openings of the display panel in FIG. 2, FIG. 4 is a second schematic cross-sectional structural diagram of the display panel according to an embodiment of the present disclosure, and FIG. 5 is a partial schematic structural top view of the first openings and the second openings of the display panel in FIG. 4.

In this embodiment, an orthographic projection of the second openings V2 on the substrate 101 covers an orthographic projection of the first openings V1 on the substrate 101. In this embodiment, the shielding layer 112 can shield a part of lower metal wirings. The orthographic projection of the shielding layer 112 on the substrate 101 does not overlap the orthographic projection of the light-emitting layer 113 on the substrate 101, so in this embodiment, the visible mura phenomenon can be significantly improved without affecting a light-emitting effect of the light-emitting layer 113.

In the embodiments, a shape of the orthographic projection of the second openings V2 on the substrate 101 is same as that of the orthographic projection of corresponding first openings V1 on the substrate 101. That is, the shape of the orthographic projection of the second openings V2 on the substrate 101 is same as that of the orthographic projection of corresponding light-emitting layer 113 on the substrate 101. Each pixel unit 115 being arranged in a pearl type arrangement is taken as an example for description. Each pixel unit 115 includes two red light-emitting pixels, two blue light-emitting pixels, and four green light-emitting pixels. Shapes of the red light-emitting pixels and the blue light-emitting pixels are octagonal, and a shape of the green light-emitting pixels is oval. Then, in this embodiment, the shape of the orthographic projection of the second openings V2 on the substrate 101 is octagonal or oval.

Of course, in other embodiments, the pixel unit 115 may use other arrangement method. The shape of the orthographic projection of the light-emitting layer 113 on the substrate 101 may also be rectangular, circular, or other polygonal. The shape of the second openings V2 may also be different from the shape of the first openings V1, which is not limited in the present disclosure, and the second openings V2 may be designed according to an arrangement method and the shape of the first openings V1.

Specifically, a ratio of an orthographic projection area of the second openings V2 on the substrate 101 to an orthographic projection area of the first openings V1 on the substrate 101 ranges from 1 to 1.5.

This embodiment includes two situations. The first situation is that referring to FIGS. 2 and 3, a gap is between an edge of the orthographic projection of the second openings V2 on the substrate 101 and an edge of the orthographic projection of the first openings V1 on the substrate 101. That is, the orthographic projection area of the second openings V2 on the substrate 101 is greater than the orthographic projection area of the first openings V1 on the substrate 101. That is, the ratio of the orthographic projection area of the second openings V2 on the substrate 101 to the orthographic projection area of the first openings V1 on the substrate 101 is greater than 1 and is less than or equal to 1.5.

The second situation is that referring to FIGS. 4 and 5, a difference between FIGS. 4 and 2 and between FIGS. 5 and 3 is that the edge of the orthographic projection of the second openings V2 on the substrate 101 completely overlaps the edge of the orthographic projection of the first openings V1 on the substrate 101. That is, the orthographic projection area of the second openings V2 on the substrate 101 is equal to the orthographic projection area of the first openings V1 on the substrate 101. That is, the ratio of the orthographic projection area of the second openings V2 on the substrate 101 to the orthographic projection area of the first openings V1 on the substrate 101 is equal to 1. It can be understood that compared to the first situation, an area of the lower metal wirings shielded by the shielding layer 112 in the second situation is larger, thereby better improving the visible mura.

Figure 6:
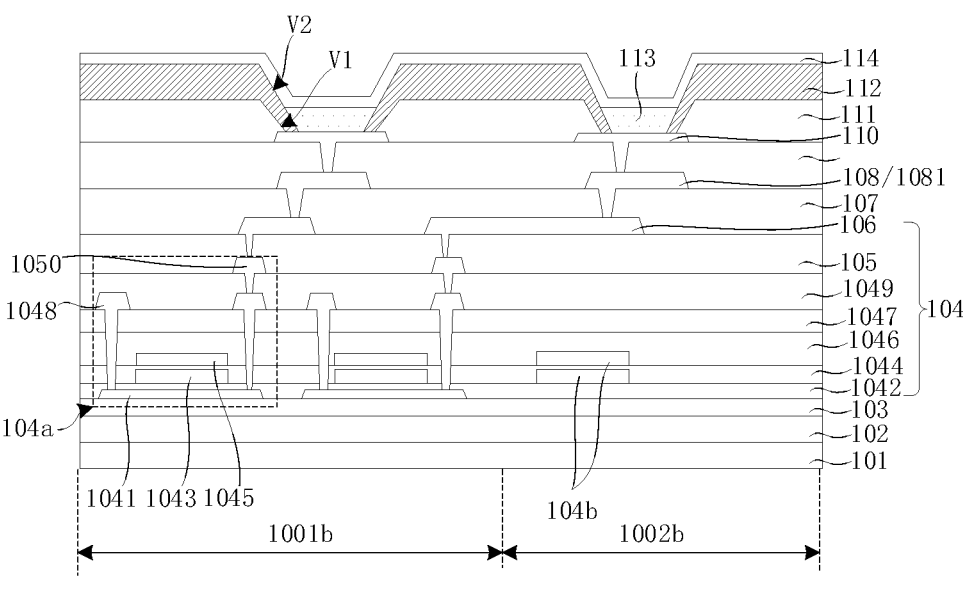
FIG. 6 is a third schematic cross-sectional structural diagram of the display panel along line A-A in FIG. 1.
Figure 7:
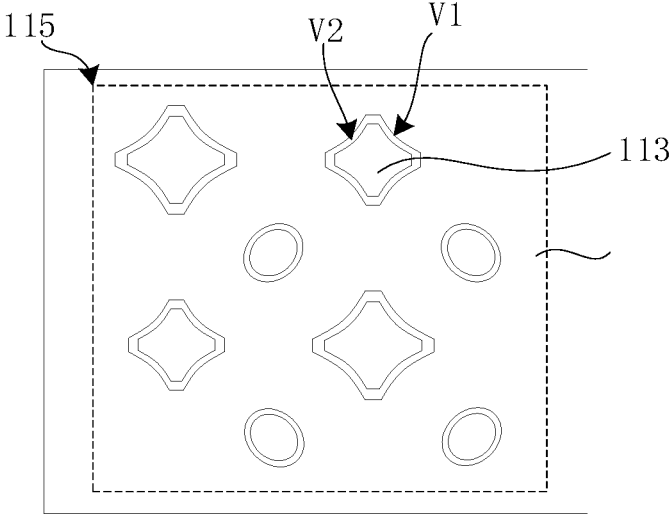
FIG. 7 is a partial schematic structural top view of the first openings and the second openings of the display panel in FIG. 6 according to an embodiment of the present disclosure.

In an embodiment of the present disclosure, referring to FIGS. 6 and 7, FIG. 6 is a third schematic cross-sectional structural diagram of the display panel according to an embodiment of the present disclosure, and FIG. 7 is a partial schematic structural top view of the first openings and the second openings of the display panel in FIG. 6. A difference between FIGS. 6 and 2 and between FIGS. 7 and 3 is that the orthographic projection of the first openings V1 on the substrate 101 covers the orthographic projection of the second openings V2 on the substrate 101. In this embodiment, the shielding layer 112 can shield almost all the lower metal wirings. Since the orthographic projection of the shielding layer 112 on the substrate 101 partially overlaps the orthographic projection of the light-emitting layer 113 on the substrate 101, so an effective light-emitting area of the light-emitting layer 113 is reduced. Therefore, compared to FIGS. 2 and 4, this embodiment can further improve the visible mura but sacrifices the light-emitting effect of the light-emitting layer 113.

Specifically, the ratio of the orthographic projection area of the second openings V2 on the substrate 101 to the orthographic projection area of the first openings V1 on the substrate 101 ranges from 0.8 to 1. The orthographic projection area of the second openings V2 on the substrate 101 cannot be too small, or the light-emitting effect of the light-emitting layer 113 in the fan-out display area 100b will be greatly reduced, thereby causing display effects between the fan-out display area 100b and the normal display area 100a to have an overly large difference, reducing display uniformity.

Figure 8:
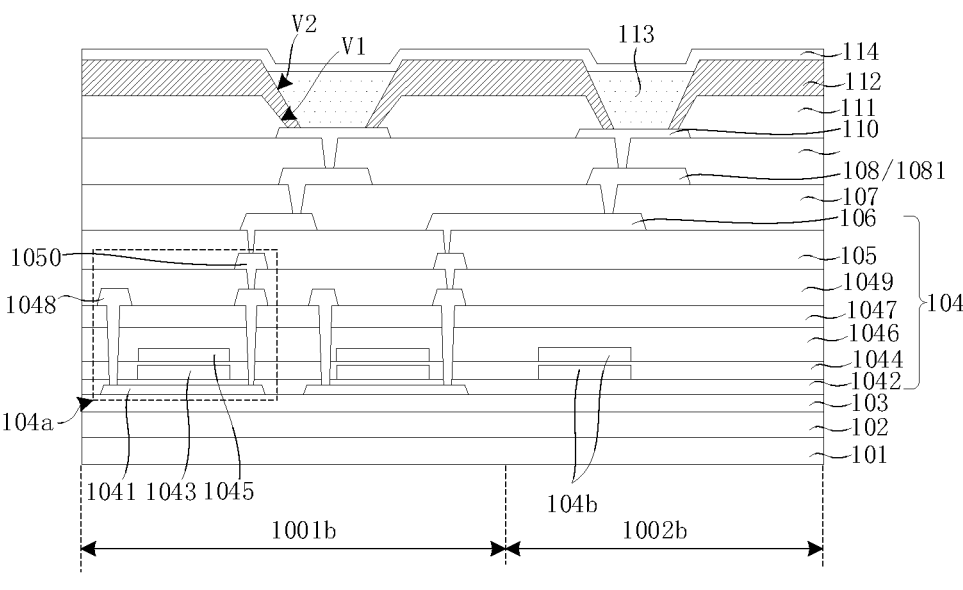
FIG. 8 is a fourth schematic cross-sectional structural diagram of the display panel along line A-A in FIG. 1.
Figure 9:
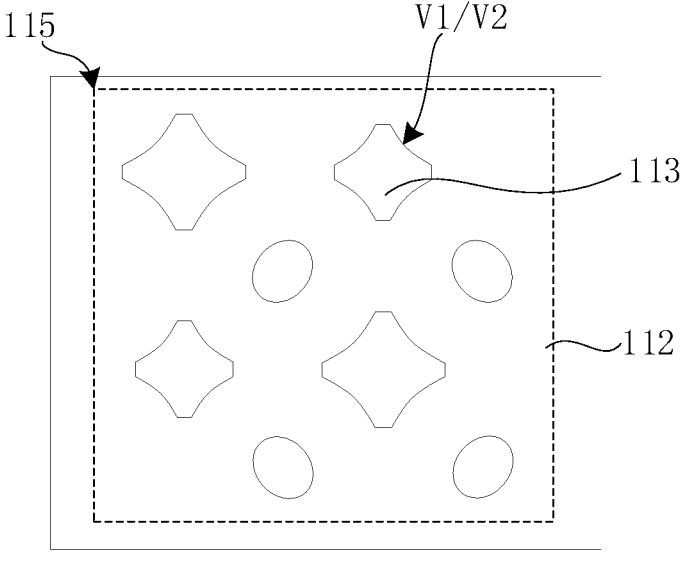
FIG. 9 is a partial schematic structural top view of the first openings and the second openings of the display panel in FIG. 8 according to an embodiment of the present disclosure.

Further, in an embodiment of the present disclosure, referring to FIGS. 8 and 9, FIG. 8 is a fourth schematic cross-sectional structural diagram of the display panel according to an embodiment of the present disclosure, and FIG. 9 is a partial schematic structural top view of the first openings and the second openings of the display panel in FIG. 8. A difference between FIGS. 8 and 6 and between FIGS. 9 and 7 is that in order to improve the disadvantage that the light-emitting effect of the light-emitting layer 113 is reduced, the light-emitting layer 113 covers a side wall and a bottom of the second openings V2. That is, the shielding layer 112 play a role of the pixel definition layer 111, and the second openings V2 are equivalent to the pixel openings. Preferably, the light-emitting layer 113 completely covers the side wall and the bottom of the second openings V2. Since a height of the shielding layer 112 is higher than a height of the pixel definition layer 111, that is, a height of the second openings V2 is higher than a height of the first openings V1, this embodiment can increase the effective light-emitting area of the light-emitting layer 113 by disposing the light-emitting layer 113 in the second openings V2. Therefore, it is beneficial to improve the light-emitting effect of the light-emitting layer 113, thereby realizing the objective of improving the visible mura without affecting the light-emitting effect of the light-emitting layer 113.

Figure 10:
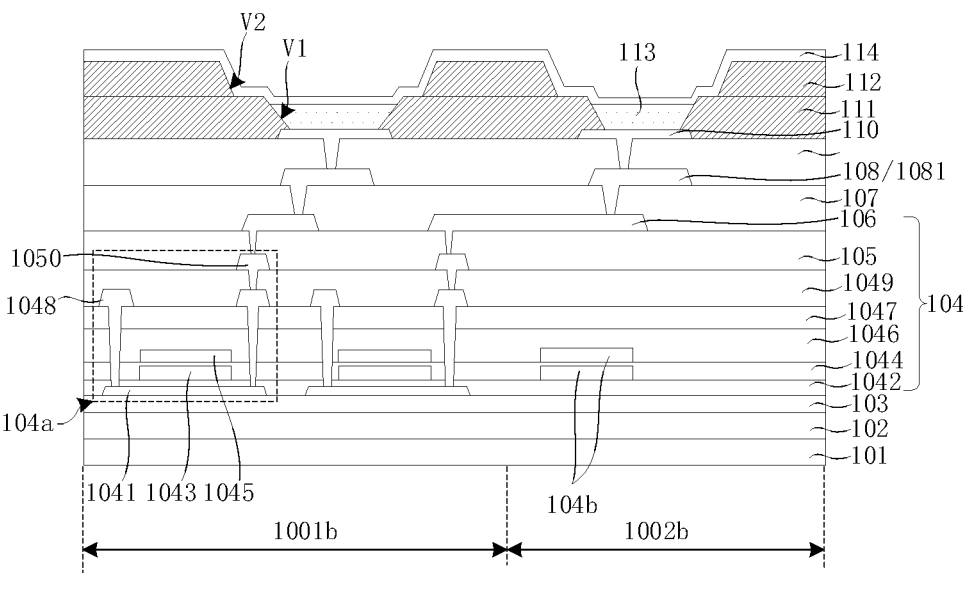
FIG. 10 is a fifth schematic cross-sectional structural diagram of the display panel along line A-A in FIG. 1.

In an embodiment, referring to FIG. 10, FIG. 10 is a fifth schematic cross-sectional structural diagram of the display panel according to an embodiment of the present disclosure. A difference between FIG. 10 and FIG. 2 is that the pixel definition layer 111 and the shielding layer 112 use a same light shielding material. Optionally, a material of the pixel definition layer 111 is also the black matrix. It can be understood that the pixel definition layer 111 not only plays a role of limiting the light-emitting layer 113, but also plays a same role as the shielding layer 112. Therefore, the pixel definition layer 111 can shield most of the pixel driving circuit units 104a, the fan-out wirings 104b, and the connecting wirings 1081, thereby further improving the visible mura. In addition, compared to FIG. 2, in this embodiment, the thickness of the shielding layer 112 may be set thinner, and even the technical problem of the present disclosure can be solved without setting the shielding layer 112, thereby being beneficial to realize thinning and lightening of the display panel.

In the embodiments of the present disclosure, the display panel further includes a cathode 114, and the shielding layer 112 is disposed between the cathode 114 and the pixel definition layer 111. In FIGS. 2 and 10, the cathode 114 covers the pixel definition layer 111, the shielding layer 112, and the light-emitting layer 113. In FIGS. 4, 6, and 8, the cathode 114 covers the shielding layer 112 and the light-emitting layer 113.

In the embodiments of the present disclosure, the display panel further includes an electron injection layer, an electron transport layer, a hole transport layer, and a hole injection layer disposed in sequence along the direction away from the substrate 101. The electron injection layer, the electron transport layer, the hole transport layer, and the hole injection layer are disposed in the first openings V1. The electron injection layer and the electron transport layer are disposed between the light-emitting layer 113 and the anodes 110. The hole transport layer and the hole injection layer are disposed between the light-emitting layer 113 and the cathode 114.

In the embodiments of the present disclosure, the display panel further includes an encapsulation layer covering one side of the cathode 114 away from the substrate 101, and the encapsulation layer is configured to encapsulate the light-emitting layer 113 to prevent external water vapor and oxygen from intruding and damaging the light-emitting layer 113. The encapsulation layer may be formed using thin film encapsulation, and the encapsulation layer may be a single-layer or multi-layer encapsulation stacked structure. Preferably, the encapsulation layer adopts an inorganic/ organic/inorganic multi-layer encapsulation stacked structure, which is beneficial to improve an encapsulation effect.

In the embodiments of the present disclosure, the display panel further includes a touch layer disposed on one side of the encapsulation layer away from the substrate 101, and a touch control type of the touch layer may be a self-capacitive type or a mutual capacitive type. The touch control type of the touch layer may be selected according to actual situations, and is not limited in the present disclosure.

In the embodiments of the present disclosure, the display panel further includes a polarizer and a coverplate stacked in sequence on one side of the touch layer away from the substrate 101. The polarizer is attached to a surface of the touch layer away from the substrate 101 by an optical adhesive, and the coverplate is attached to a surface of the polarizer away from the substrate 101 by the optical adhesive.

An embodiment of the present disclosure further provides a display device, which includes the display panel in the above embodiments. The display device includes fixed terminals such as televisions and desktop computers, mobile terminals such as mobile phones and notebook computers, and wearable devices such as wristbands, virtual display (VR) devices, and augmented display (AR) devices.

An embodiment of the present disclosure further provides a manufacturing method of the display panel. The display panel includes the normal display area 100*a* and the fan-out display area 100*b* disposed on one side of the normal display area 100*a*. The fan-out display area 100*b* includes the first area 1001*b* and the second area 1002*b* arranged in sequence in the direction from the normal display area 100*a* toward the fan-out display area 100*b*. The manufacturing method includes following steps.

Providing a substrate 101;

disposing the driving circuit layer 104 on one side of the substrate 101, wherein, the driving circuit layer 104 includes the plurality of pixel driving circuit units 104*a* and the plurality of fan-out wirings 104*b*, the pixel driving circuit units 104*a* are disposed in the normal display area 100*a* and the first area 1001*b*, the fan-out wirings 104*b* are disposed in the second area 1002*b*, and the density of the pixel driving circuit units 104*a* disposed in the first area 1001*b* is greater than the density of the pixel driving circuit units 104*a* disposed in the normal display area 100*a;* disposing the at least one connecting wiring layer on one side of the driving circuit layer 104 away from the substrate 101, wherein, each connecting wiring layer includes the plurality of connecting wirings;

disposing the plurality of anodes 110 on one side of the at least one connecting wiring layer away from the substrate 101;

disposing the pixel definition layer 111 on one side of the at least one connecting wiring layer away from the substrate 101, wherein, the pixel definition layer 111 includes the plurality of first openings V1 exposing at least a part of the anodes 110;

disposing the shielding layer 112 on one side of the pixel definition layer 111 away from the substrate 101, wherein, the shielding layer 112 includes the plurality of second openings V2 defined corresponding to the first openings V1; and disposing the light-emitting layer 113 in the first openings V1.

The beneficial effect is that in the display panel and the display device provided in the embodiments of the present disclosure, by disposing the shielding layer on one side of the pixel definition layer away from the substrate and allowing the second openings of the shielding layer to correspond to the first openings of the pixel definition layer, the shielding layer can be used to block light reflected by the metal wirings. Therefore, the light reflected by the metal wirings in the fan-out display area and the normal display area are more uniform, thereby being beneficial to improve the visible mura phenomenon in the fan-out display area and the normal display area caused by the densities of the metal wirings in the fan-out display area and the normal display area being different when screens are turned off and turned on.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising a normal display area and a fan-out display area disposed on one side of the normal display area, wherein the fan-out display area comprises a first area and a second area arranged in sequence in a direction from the normal display area toward the fan-out display area, and the display panel comprises:

a substrate;

a driving circuit layer disposed on one side of the substrate and comprising a plurality of pixel driving circuit units and a plurality of fan-out wirings, wherein the pixel driving circuit units are disposed in the normal display area and the first area, the fan-out wirings are disposed in the second area, and a density of the pixel driving circuit units disposed in the first area is greater than a density of the pixel driving circuit units disposed in the normal display area;

at least one connecting wiring layer disposed on one side of the driving circuit layer away from the substrate, wherein each connecting wiring layer comprises a plurality of connecting wirings;

a plurality of anodes disposed on one side of the at least one connecting wiring layer away from the substrate, wherein the pixel driving circuit units are electrically connected to corresponding anodes by the connecting wirings;

a pixel definition layer disposed on one side of the at least one connecting wiring layer away from the substrate and comprising a plurality of first openings exposing at least a part of the anodes; and a light-emitting layer disposed in the first openings;

wherein the display panel further comprises a shielding layer in the fan-out display area, the pixel definition layer and the shielding layer use a same light-shielding material, and the shielding layer is disposed on one side of the pixel definition layer away from the substrate and comprises a plurality of second openings defined corresponding to the first openings;

an orthographic projection area of the second openings on the substrate is same as an orthographic projection area of the first openings on the substrate.

2. The display panel according to claim 1, wherein a thickness of the shielding layer in a direction perpendicular to the substrate ranges from 1 μm to 1.5 μm.

3. The display panel according to claim 1, wherein a material of the shielding layer comprises a black matrix.

4. The display panel according to claim 1, further comprising a cathode, wherein the shielding layer is disposed between the cathode and the pixel definition layer.

5. A display panel, comprising a normal display area and a fan-out display area disposed on one side of the normal display area, wherein the fan-out display area comprises a first area and a second area arranged in sequence in a direction from the normal display area toward the fan-out display area, and the display panel comprises:

a substrate;

a driving circuit layer disposed on one side of the substrate and comprising a plurality of pixel driving circuit units and a plurality of fan-out wirings, wherein the pixel driving circuit units are disposed in the normal display area and the first area, the fan-out wirings are disposed in the second area, and a density of the pixel driving circuit units disposed in the first area is greater than a density of the pixel driving circuit units disposed in the normal display area;

at least one connecting wiring layer disposed on one side of the driving circuit layer away from the substrate, wherein each connecting wiring layer comprises a plurality of connecting wirings;

a plurality of anodes disposed on one side of the at least one connecting wiring layer away from the substrate, wherein the pixel driving circuit units are electrically connected to corresponding anodes by the connecting wirings;

a pixel definition layer disposed on one side of the at least one connecting wiring layer away from the substrate and comprising a plurality of first openings exposing at least a part of the anodes; and a light-emitting layer disposed in the first openings;

wherein the display panel further comprises a shielding layer in the fan-out display area and disposed on one side of the pixel definition layer away from the substrate and comprising a plurality of second openings defined corresponding to the first openings;

an orthographic projection area of the second openings on the substrate is same as an orthographic projection area of the first openings on the substrate.

6. The display panel according to claim 5, wherein a thickness of the shielding layer in a direction perpendicular to the substrate ranges from 1 μm to 1.5 μm.

7. The display panel according to claim 5, wherein a material of the shielding layer comprises a black matrix.

8. The display panel according to claim 5, further comprising a cathode, wherein the shielding layer is disposed between the cathode and the pixel definition layer.

9. The display panel according to claim 5, wherein the at least one connecting wiring layer comprises a first connecting wiring layer and a second connecting wiring layer, and the display panel further comprises a first planarization layer, a second planarization layer, and a third planarization layer stacked in sequence in a direction away from the substrate;

the first planarization layer covers the side of the driving circuit layer away from the substrate, the first connecting wiring layer is disposed between the first planarization layer and the second planarization layer, and the second connecting wiring layer is disposed between the second planarization layer and the third planarization layer; and the driving circuit layer is electrically connected to the connecting wirings in the first connecting wiring layer by through-holes penetrating the first planarization layer, the first connecting wiring layer is electrically connected to the connecting wirings in the second connecting wiring layer by through-holes penetrating the second planarization layer, and the second connecting wiring layer is electrically connected to the anodes by through-holes penetrating the third planarization layer.

10. A display device, comprising a display panel comprising a normal display area and a fan-out display area disposed on one side of the normal display area, wherein the fan-out display area comprises a first area and a second area arranged in sequence in a direction from the normal display area toward the fan-out display area, and the display panel comprises:

a substrate;

a driving circuit layer disposed on one side of the substrate and comprising a plurality of pixel driving circuit units and a plurality of fan-out wirings, wherein the pixel driving circuit units are disposed in the normal display area and the first area, the fan-out wirings are disposed in the second area, and a density of the pixel driving circuit units disposed in the first area is greater than a density of the pixel driving circuit units disposed in the normal display area;

at least one connecting wiring layer disposed on one side of the driving circuit layer away from the substrate, wherein each connecting wiring layer comprises a plurality of connecting wirings;

a plurality of anodes disposed on one side of the at least one connecting wiring layer away from the substrate, wherein the pixel driving circuit units are electrically connected to corresponding anodes by the connecting wirings;

a pixel definition layer disposed on one side of the at least one connecting wiring layer away from the substrate and comprising a plurality of first openings exposing at least a part of the anodes; and a light-emitting layer disposed in the first openings;

wherein the display panel further comprises a shielding layer in the fan-out display area and disposed on one side of the pixel definition layer away from the substrate and comprising a plurality of second openings defined corresponding to the first openings;

an orthographic projection area of the second openings on the substrate is same as an orthographic projection area of the first openings on the substrate.

\* \* \* \* \*